United States Patent [19]
Kocis

[11] Patent Number: 5,559,753
[45] Date of Patent: Sep. 24, 1996

[54] APPARATUS AND METHOD FOR PREVENTING BUS CONTENTION DURING POWER-UP IN A COMPUTER SYSTEM WITH TWO OR MORE DRAM BANKS

[75] Inventor: Thomas J. Kocis, Austin, Tex.

[73] Assignee: Dell USA, L.P., Austin, Tex.

[21] Appl. No.: 378,164

[22] Filed: Jan. 25, 1995

[51] Int. Cl.$^6$ ................................................. G11C 8/00
[52] U.S. Cl. ................................. 365/236; 365/189.05
[58] Field of Search ........................... 365/230.03, 236, 365/233, 189.05, 193; 326/56, 57, 86

[56] References Cited

U.S. PATENT DOCUMENTS

| | | | |
|---|---|---|---|
| 5,311,483 | 5/1994 | Takasugi | 365/236 |
| 5,343,439 | 8/1994 | Hoshino | 365/236 |
| 5,362,996 | 11/1994 | Yizraeli | 326/86 |

OTHER PUBLICATIONS

Micron Technology, Inc., *DRAM Data Book*, 1992, pp. 1–79.

Primary Examiner—A. Zarabian
Attorney, Agent, or Firm—Henry N. Garrana; Mark P. Kahler; Michelle M. Turner

[57] ABSTRACT

A DRAM circuit is disclosed with circuitry for disabling data output drivers to prevent bus contention during system power-up. The circuitry includes a counter for counting RAS (or CAS) signals, and for disabling the output data drivers until 7 RAS (or CAS) signals are counted. The output of the counter (called Keep Off) connects to each of the tri-state buffer output drivers, through an AND gate. Other inputs to the AND gate may include an output signal Pwrup from a voltage detection circuit, and other enable signals. The counter uses the RAS signals as a clock signal to three D flip-flops. The Pwrup signal also is used as a reset to each of the flip-flops. The Q output of the flip-flops are anded together, to produce a signal which is released when the count reaches 111.

32 Claims, 5 Drawing Sheets

APPARATUS AND METHOD FOR PREVENTING BUS CONTENTION DURING POWER-UP IN A COMPUTER SYSTEM WITH TWO OR MORE DRAM BANKS

BACKGROUND OF THE INVENTION

The present invention relates generally to a computer system with two or more banks of dynamic random access memory (DRAM) chips. More particularly, the invention concerns problems which may arise on a memory bus during system power-up. Still more particularly, the present invention relates to a system for preventing contention on the memory bus between conflicting data signals from two or more DRAM banks.

FIG. 1 is a block diagram of a conventional computer system 10 that comprises a microprocessor or central processing unit ("CPU") 5, a local bus 7 coupled to the CPU 5 and to a memory controller 8. A system memory 12 also is shown coupled to the memory controller 8 through a memory bus 11. Power for the CPU 5, memory controller 8 and memory 12 is provided by one or more power supply circuits, generally denoted as 13 in FIG. 1. The microprocessor 5 shown in FIG. 1 may comprise, for example, any of the INTEL 8086® family of microprocessors (or a compatible device), and the local bus 7 could comprise an 8086 style local bus. The CPU local bus 7 typically includes a set of data lines D[31:0], a set of address lines A[31:0], and a set of control lines (not shown specifically). Details regarding the various bus cycles and protocols of the CPU local bus 7 are not discussed in detail herein, as they are not required for an understanding of the present invention, and are well known by those in the art. CPU 5 and memory controller 8 may be contained on separate chips, or may be fabricated on a single integrated processor chip.

The memory controller 8 controls data transactions to system memory 12. Thus, all read and write cycles to memory 12 are transmitted to the memory controller 8. In response, the memory controller 8 addresses the desired elements in memory 12 and performs either a read or write to the selected address in memory based upon the status of a read/write control line (not shown specifically) in the memory bus 11.

The system memory 12 typically includes banks of dynamic random access memory (DRAM) circuits. Two DRAM banks are shown in FIG. 1 for purposes of illustration. Many computer systems available commercially can accept at least four DRAM banks. The DRAM connects to the memory controller 8 via the memory bus 11, comprised of memory address lines, memory data lines, and various control lines. The DRAM banks, according to normal convention, comprise the working memory of the CPU 5.

Because several DRAM banks connect to the memory bus 11 in a typical computer system, precautionary steps must be taken to prevent multiple devices from simultaneously driving signals on the memory bus 11. For example, and referring now to FIG. 2, if DRAM bank #1 attempted to drive a "1" on data line D0 of the memory bus 11 while DRAM bank #2 simultaneously attempted to drive a "0" on data line D0, problems obviously would arise with bus contention, as two different signals were driven on the same line at substantially the same time.

To prevent the problem with bus contention, each DRAM bank typically includes a tri-state buffer 13 for each of its various data output lines. As will be understood by one skilled in the art, the tri-state buffer 13 is capable of driving both a low and a high output signal onto the memory bus 11, to indicate a digital "0" and a digital "1" when the output is enabled by the driver enable output from the DRAM. When the buffer 13 is not enabled, the tri-state buffer 13 functions to "disconnect" the data output line from the memory bus 11, so that neither a low or high signal is driven on the bus, and instead, the buffer presents a high impedence state thereby allowing other circuitry to determine the state of the bus. It should be noted that while FIG. 2 depicts four data lines, most conventional computer systems have at least thirty-two data lines in the memory bus 11, each of which would connect to the DRAM circuits through tri-state buffers.

An example of a conventional tri-state buffer is shown in FIG. 3. In accordance with conventional techniques, the tri-state buffer 13 receives an input signal x, and produces an output signal y, which is driven onto the associated bus line. The tri-state buffer 13 also receives an active low (or high) enable signal. If the enable signal is asserted, then the output signal y is the same as the input signal x. If, conversely, the enable signal is deasserted, then a high impedance state appears on the output of the buffer 13.

Referring again to FIG. 1, data generally is transferred between the DRAM banks and the memory controller 8 in two steps. First, the controller 8 generates signals on the address lines of the memory bus 11 representing the row address of the desired memory location, which are latched into the memory 12 when a row address strobe: (RAS) signal is asserted low by the controller 8. At the next, or at subsequent clock cycles, the memory 12 latches in the column address when a column address strobe (CAS) signal is asserted low by the memory controller 8. During a write transaction, data is latched into memory 12 on the falling edge of the CAS signal. In a read cycle, data from the selected memory cell is driven onto the data lines of the memory bus 11 shortly after the assertion of the CAS signal This method of accessing multiple DRAM banks can cause problems during system power-up. After turning on the system, the power supply 13 does not instantaneously reach its nominal operating voltage level. Instead, the power supply ramps up to its operating voltage level. A certain period of time expires from turning on the power switch of the computer (or initiating reset), before the power supply outputs become stable. This time varies from system to system and among power supplies. During this stabilization period, devices in the computer system may began operating, or may even malfunction because of the low power conditions present during the stabilization period.

One of these devices that may malfunction or prematurely begin operation is the memory controller 8. If the memory controller 8 errantly begins performing memory transactions power-up, the DRAM banks may respond by driving data signals onto the memory bus. If two DRAM banks are addressed with memory read requests at substantially the same time during power-up, bus contention may occur, as two different DRAM banks attempt to drive out conflicting signals onto the same memory bus. As a result, the system may fail, the DRAM's may latch-up, and the life of the DRAM may be shortened.

Various attempts have been made in the prior art to prevent this problem. One proposed solution is to provide a voltage detection circuit in each DRAM bank, to disconnect the control signals (such as RAS or CAS) until a sufficient voltage threshold is achieved by the power supply. Another proposed solution is to provide an analog time delay circuit to disconnect the control signals until a certain minimum time period has elapsed after power-up. FIGS. 4A and 4B illustrate a prior art design which relies primarily on an analog time delay circuit to disable the receipt of a RAS (and/or CAS) control signal giving the power supply a minimum time period to reach a nominal operating level.

The time delay circuit of FIG. 4A connects to the power supply circuit 13 of FIG. 1 by means of the power pin to the DRAM (VCC). The time delay circuit provides a power up (Pwrup) signal (active high during power-up) when the power supply begins to ramp. Qa is initally on, but Qb is off because the substrate voltage Vbb is not yet pumped down. When Qb turns on it overpowers Qa which drives the first inverter high. Capacitor $C_1$ provides an additional delay to the ramping up of the first inverter, causing Pwrup to stay high until $C_1$ is charged. When Ca is charged, the output of the second invertor goes low, causing Pwrup to also go low.

The Pwrup signal, which is the output of the time delay circuit of FIG. 4A, is provided as an input signal to the RAS buffer circuit of FIG. 4B. When Pwrup goes low, indicating that the power supply has reached a threshold voltage, transistor $Q_6$ turns off, permitting the RAS input signal to propagate to the output buffers.

The approach depicted in FIGS. 4A and 4B, therefore, implements a time delay component to delay operation until a capacitor $C_1$ is charged. The circuit also reacts to the power supply ramp time because this affects the rate at which Vbb and C1 charge. The problem with this approach, however, is that the stabilization period for the power supply may vary considerably from one system to another. Consequently, the time delay period must be designed for "worst case" scenarios, and thus time is wasted in most systems. A DRAM designed to account for a worst case slow power supply ramp may not be ready when required in a system with a fast ramp power supply. This wasted time period may become especially noticeable in certain systems, such as in portable computers with power management features. The reliance on a long time delay to prevent DRAM latch-up, is at best an inefficient solution.

SUMMARY OF THE INVENTION

The present invention solves the shortcomings and deficiencies of the prior art by constructing a circuit for disabling DRAM data output signals, which counts the number of RAS (and/or CAS) signals received by the DRAM circuit. When seven RAS signals have been detected after a threshold voltage is achieved, the DRAM data output lines are enabled. The receipt of eight RAS signals are typically required by DRAM manufacturers to wake-up the DRAM. Thus, the present invention operates under existing protocol requirements, and relieves the memory control design of the duty of preventing contention until after the first seven RAS cycles.

The counter implemented in the preferred embodiment receives as a reset input a Pwrup signal indicating that the voltage supply has reached a threshold operating level. The counter also preferably receives a buffered RAS input signal as a clock input signal. When eight RAS input signals are received after the counter is reset, the output of the counter is enabled.

In the preferred embodiment, the counter output line is ANDED together with other enable signals, and with an inverted Pwrup signal, insuring that the output drivers of the data output lines are only enabled if power up conditions are satisfactory, and after all enable conditions are met.

In one exemplary embodiment, the counter comprises a standard 3 bit binary counter constructed of three D flip-flops. The Q outputs of each flip-flop are anded together to produce a high output when the count reaches 7 (which digitally equates to 111). The high output signal from the counter also functions to disconnect the clock input signal so the counter stops when a count of seven is reached.

BRIEF DESCRIPTION OF THE DRAWINGS

For a more detailed description of the preferred embodiment of the present invention, reference will now be made to the accompanying drawings, wherein.

DETAILED DESCRIPTION OF THE PREFERRED EMBODIMENT

Figure 5:
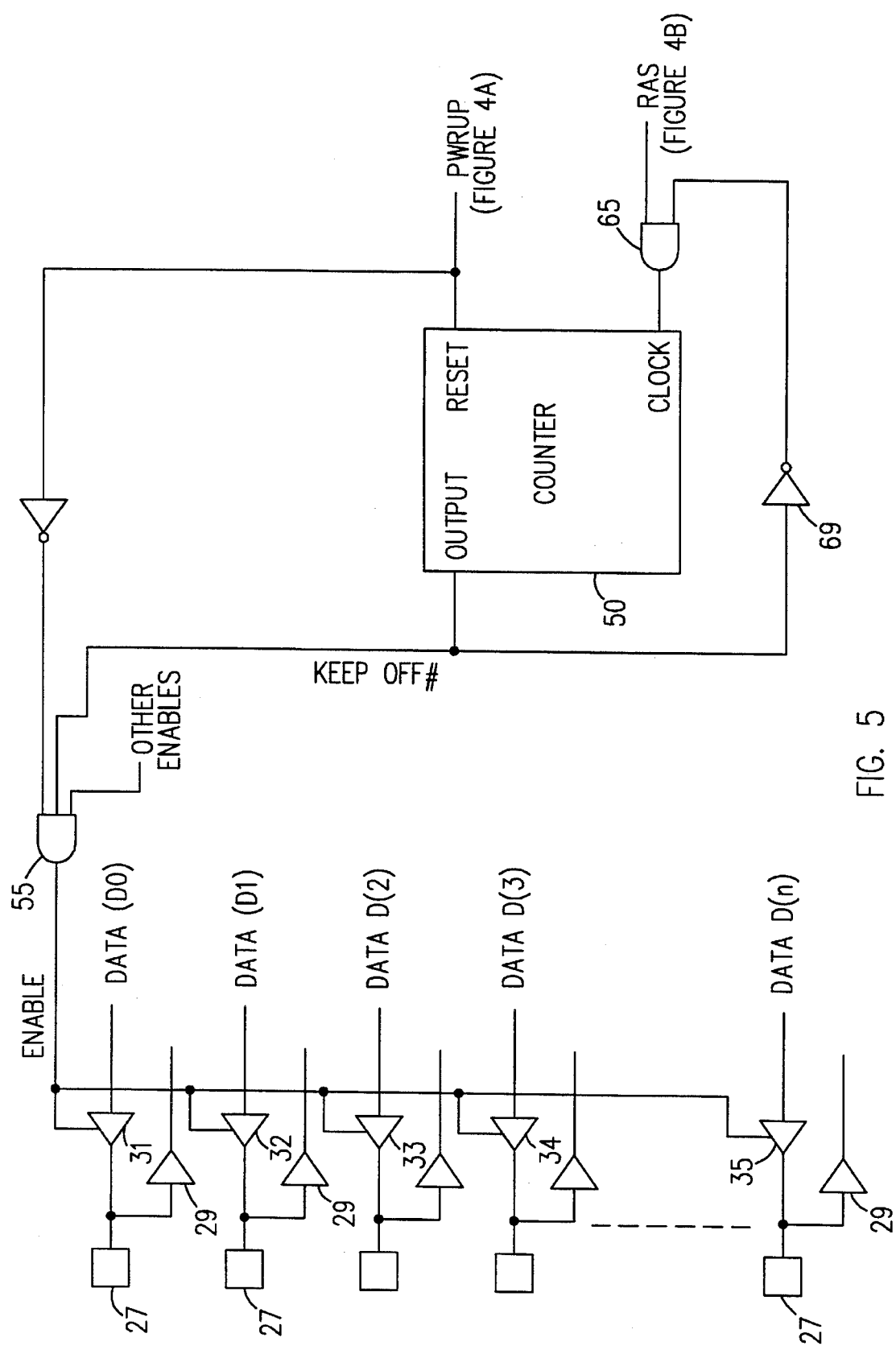
FIG. 5 is a functional drawing of a circuit, constructed in accordance with the preferred embodiment, for disabling DRAM data output drivers until power supply voltages are satisfactory and all enable conditions are met.

Referring now to FIG. 5, the disable circuit of the present invention, constructed in accordance with the preferred embodiment, generally comprises a plurality of tri-state output drivers 31, 32, 33, 34, 35 for driving data lines D0–Dn of a DRAM circuit 100, a counter 50, and an AND gate 55. Other circuits and components of the DRAM circuit 100 have not been depicted in FIG. 5, so as not to obfuscate the present invention. Moreover, the present invention preferably is used in each of the DRAM circuits that form part of the system memory. The present invention, therefore, preferably is designed to be implemented in each of the DRAM banks of FIG. 1.

Referring still to FIG. 5, the DRAM circuit 100 includes a plurality of input/output connectors or pads 27. As one skilled in the art will understand, the pads 27 connect to the data lines of the memory bus 11 (FIGS. 1 and 2), to enable the DRAM 100 to transmit data signals onto the memory bus 11 during read cycles and to receive data signals from the memory bus 11 during write cycles. If the memory bus includes 32 data lines, then 32 pads are provided in the DRAM 100 (i.e., n=32).

Figure 1:
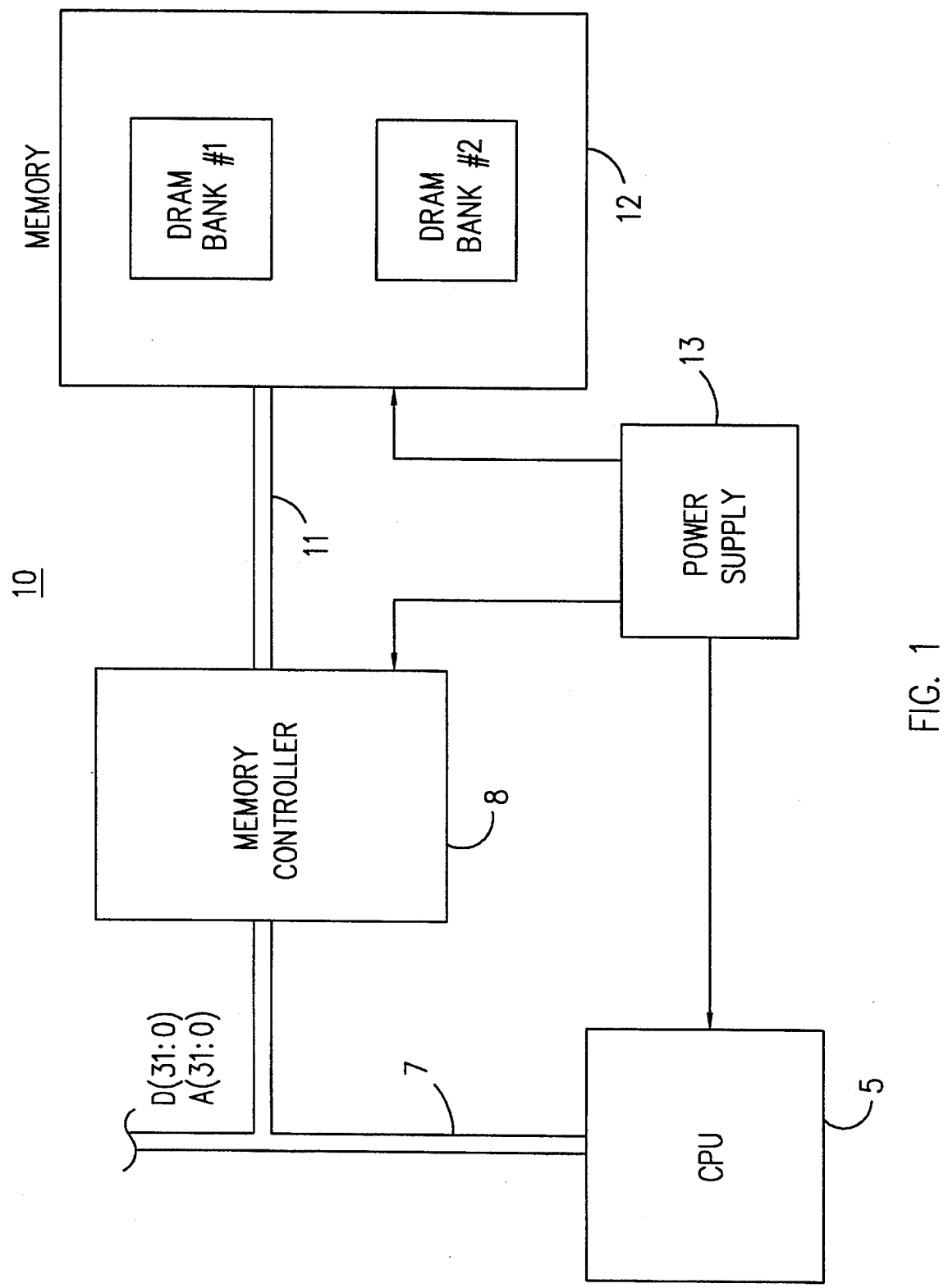
FIG. 1 depicts a functional block diagram of the memory subsystem of a conventional computer system.
Figure 2:
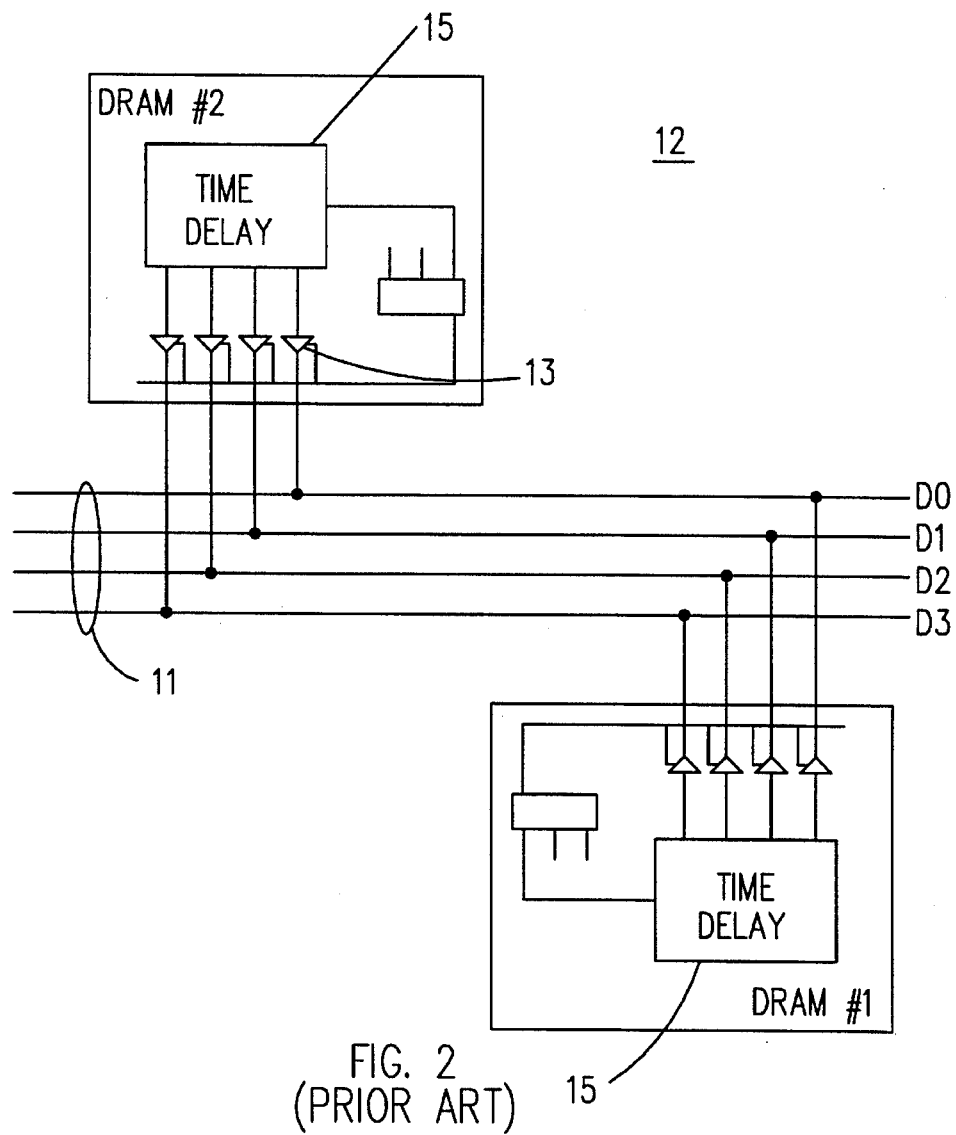
FIG. 2 is an exemplary illustration of the manner in which DRAM banks connect to data lines of a memory bus.
Figure 3:
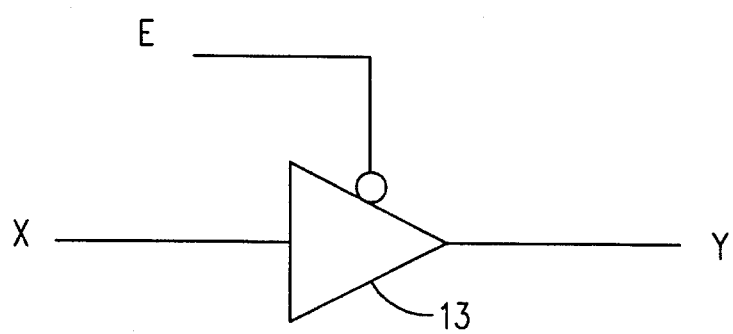
FIG. 3 is a schematic of a conventional tri-state buffer.

Data signals received from the memory bus 11 flow through level shifters 29, in accordance with conventional techniques. Similarly, all data signals transmitted onto the memory bus 11 by DRAM 100 are driven by tri-state buffers (represented in FIG. 1 as 31, 32, 33, 34, 35). In accordance with customary techniques, and as discussed in reference to FIG. 3, the tri-state buffers transmit the associated data signal only when enabled by the ENABLE line. The tri-state buffers 31, 32, 33, 34, 35 in FIG. 1 are shown as active high enables, so that these buffers only drive the data signals when the ENABLE line is high. One skilled in the art will understand that active low enables could alternatively be used without departing from the principles of the present invention.

In the preferred embodiment of FIG. 5, the ENABLE signal preferably comprises an output signal from AND gate 55. The AND gate 55 receives the following input signals in the preferred embodiment: (1) an inverted Pwrup signal from the output of the voltage detection circuit of FIG. 4A; (2) an output signal (Keep Off) from counter 50; and (3) other enable signals, which will not be discussed in detail herein as they will be apparent to one skilled in the art. The output of the AND gate 55 (which comprises the ENABLE signal), only is driven high if all input signals are high. Thus, tri-state buffers 31, 32, 33, 34, 35 only are enabled if all three input signals are high. One skilled in the art will understand that instead of using high signals and an AND gate, the same result could be achieved in various ways. For example, a NAND gate may be used with an invertor. Similarly, active low signals could be used as inputs to a NOR gate. Numerous other arrangements and alternative embodiments are available using the principles of the present invention.

Figure 4A:
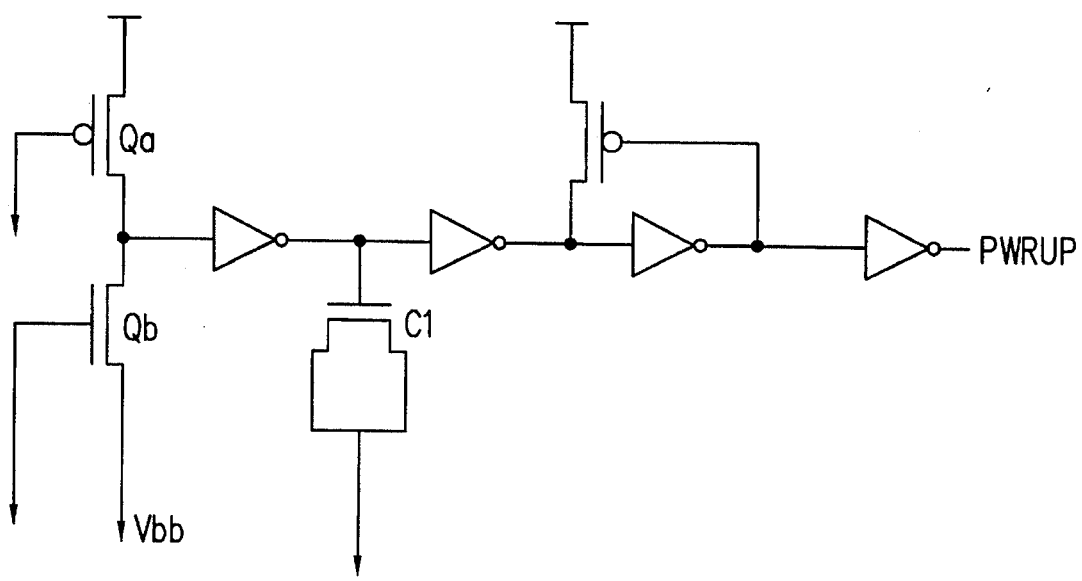
FIG. 4A is a schematic drawing .of a voltage detection circuit provided in prior art DRAM circuits.

The Pwrup input signal preferably comprises the output signal of FIG. 4A, which already is available on certain prior art DRAM chips. The Pwrup signal is an active low signal, which indicates that the power supply has ramped to a certain absolute threshold voltage value. Until the voltage supply has reached the threshold value (which will vary from circuit to circuit depending upon the proper operating voltage and other considerations), the AND gate 55 keeps the ENABLE line low, disabling the tri-state buffers 31, 32, 33, 34, 35, thus preventing possible bus contention during start-up or reset.

Protocol from certain DRAM vendors require that eight or more RAS signals or CAS before RAS cycles must be received by the DRAM for proper operation. See e.g., DRAM Data Book, Micron Technologies (1992), at p. 1–79, n. 7. These eight RAS, or CAS before RAS, cycles serve as a "wake-up" for the DRAM chip. The present invention takes advantage of these preliminary cycles already required as part of the DRAM start-up protocol in designing a scheme to disable the output data drivers of the DRAM 100, thereby preventing bus contention.

In the preferred embodiment of the present invention, the counter 50 counts the number of RAS signals received from the memory controller 8 (of FIG. 1). After the counter 50 counts eight RAS signals, an output signal (Keep Off) is generated by the counter. As one skilled in the art will understand, various counters may be used to implement this invention. In addition, one skilled in the art will understand that in appropriate circumstances, the number of CAS signals, or the number of RAS and CAS signals, may be used instead of counting RAS signals.

Figure 6:
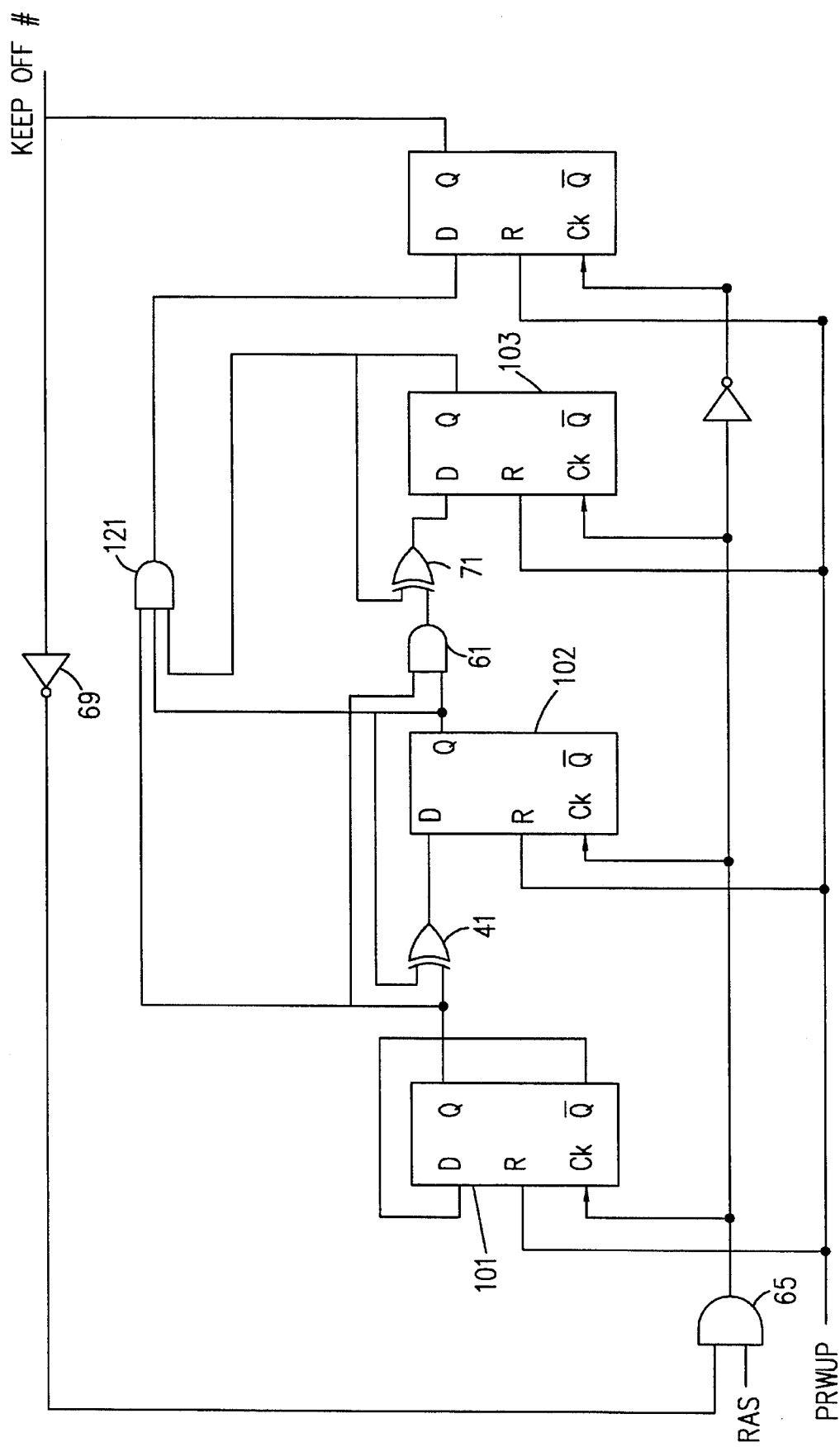
FIG. 6 is a schematic illustration of an exemplary counter circuit for use in the system of FIG. 5.

As shown in the exemplary embodiment of FIG. 6, the counter 50 may be constructed as a standard 3 bit BCD counter, comprising three D flip-flops 101, 102, 103. In accordance with known techniques, the Q(bar) output of flip-flop 101 connects to the D input of that flip-flop 101. The Q output of flip-flop 101 connects as an input to an Exclusive-OR gate 41. The second input of Exclusive-OR gate 41 comprises the Q output of flip-flop 102. The output of Exclusive-OR gate 41 connects to the D input of flip-flop 102.

Referring still to the exemplary counter design of FIG. 6, the Q output of flip-flop 102 also connects as an input to AND gate 61. The AND gate 61 also receives as an input the Q output of flip-flop 101. The output of AND gate 61 connects as an input to Exclusive-OR gate 71, which also receives the Q output of flip-flop 103 as an input. The output of Exclusive-OR gate 71 connects to the D input of flip-flop 103.

The Keep Off counter output signal can be obtained by combining the Q outputs of flip-flops 101, 102, 103 as inputs to AND gate 121. The output of AND gate 121 therefore comprises the Keep Off signal. The Keep Off signal preferably is inverted by invertor 69 and provided as an input to AND gate 65.

In accordance with known techniques, the 3 bit counter of FIG. 6 (comprised of the Q outputs of flip-flops 101, 102, 103) counts from 0 to 7, as follows: 000, 001, 010, 011, 100, 101, 110, 111. In the preferred design, the Q output of flip-flop 101 comprises the least significant binary bit, while the Q output of flip-flop 103 comprises the most significant bit. When the counter 50 reaches a count of 7 in this design, the Keep Off signal is driven high through AND gate 121.

Figure 4B:
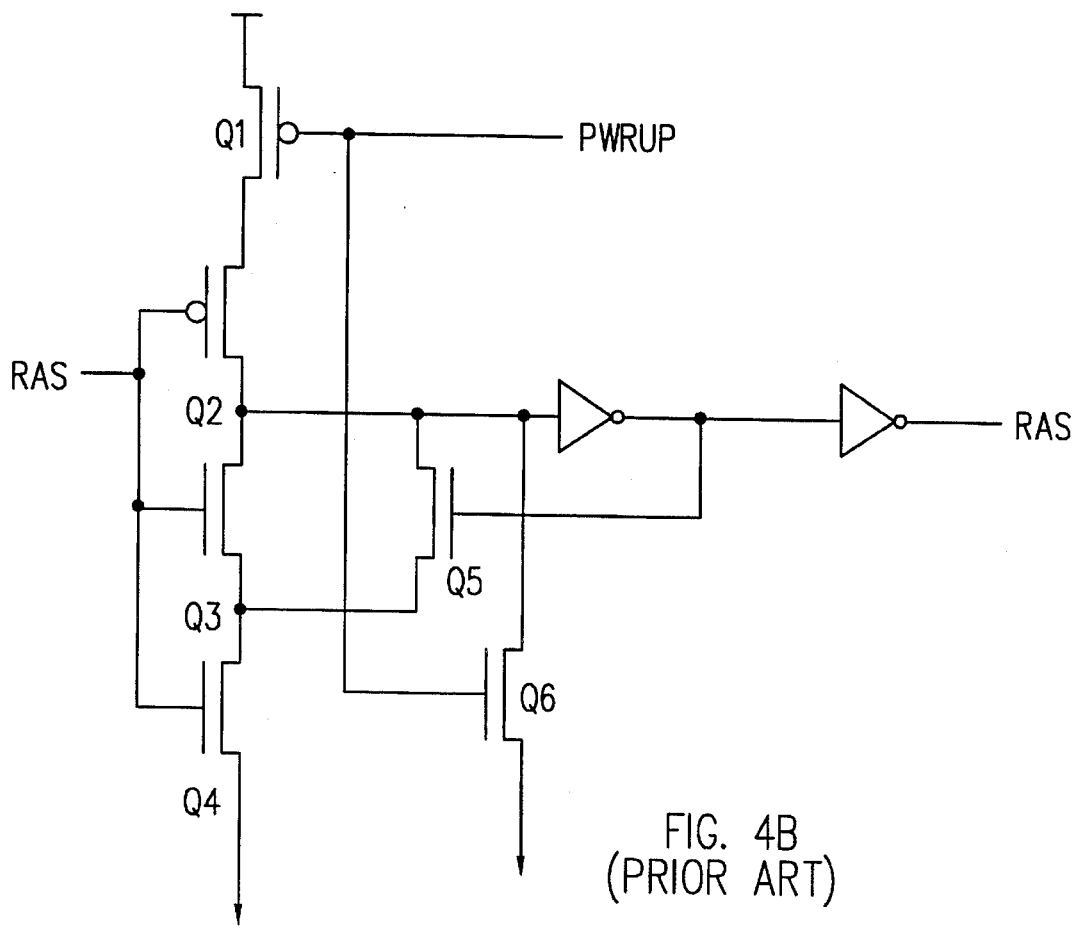
FIG. 4B is a schematic illustration of a prior art RAS buffer, with time delay circuitry, which receives the output from the voltage detection circuit of FIG. 4A.

As shown in FIGS. 5 and 6, the Pwrup output signal from the voltage detector circuit of FIG. 4A preferably is provided as a reset input to the flip-flops 101, 102, 103. Similarly, the conditioned RAS signal, which can be obtained from the circuit of FIG. 4B, may be used as the clock signal for the flip-flops 101, 102, 103. This design assumes RAS is an active high design; if conversely, RAS is active low, then an invertor can be added, or other alternative arrangements can be taken, as will be understood by one skilled in the art.

The RAS input signal preferably is anded together with the inverted Keep Off signal in AND gate 65. The Keep Off signal, which comprises the output from counter 50, is inverted through invertor 69 and provided as an input to AND gate 65. Once the Keep Off signal is driven high by the counter 50, the clock input of the counter 50 is disabled by the low input on AND gate 65 from the inverted Keep Off signal.

While a preferred embodiment of the invention has been shown and described, many modifications can be made by one skilled in the art without departing from the spirit of the invention.

I claim:

1. A memory subsystem for a computer, comprising:
   random access memory connected to a memory controller through a memory bus;
   a plurality of memory data lines in said memory connected to the memory bus;
   an output buffer connected to each of said memory data lines for driving data onto said memory bus, each of said output buffers including an input line for enabling or disabling said output buffer;
   a counter coupled to said output buffer, said counter producing an output signal that enables or disables said output buffers;
   wherein said counter counts the number of control signals generated by said memory controller, and enables said output buffers when the count reaches a predetermined value.

2. A memory subsystem as in claim 1, wherein said random access memory comprises a bank of DRAM circuits.

3. A memory subsystem as in claim 2, wherein the bank of DRAM circuits comprise at least two DRAM chips.

4. A memory subsystem as in claim 3, further comprising a power supply circuit providing power to the bank of DRAM circuits.

5. A DRAM circuit as in claim 4, further comprising a voltage detection circuit for detecting when the power supply has reached a minimum threshold operating voltage, and producing an output signal indicative thereof.

6. A memory subsystem as in claim 5, wherein said control signals comprise row address strobe (RAS) signals.

7. A memory subsystem as in claim 4, wherein said control signals comprise column address strobe (CAS) signals.

8. A memory subsystem as in claim 4, wherein said control signals comprise column address strobe (CAS) signals and row address strobe (RAS) signals.

9. A memory subsystem as in claim 6, wherein the RAS signals are used as a clock signal for said counter.

10. A memory subsystem as in claim 9, wherein said counter receives as a reset input the output signal from said voltage detection circuit.

11. A memory subsystem as in claim 10, wherein said counter comprises three flip-flops forming a three bit binary counter.

12. A memory subsystem as in claim 11, wherein each of the outputs of said three flip-flops are anded together to produce the counter output signal.

13. A memory subsystem as in claim 12, wherein said counter output signal disables the clock signal when the counter output signal is asserted.

14. A memory subsystem as in claim 5, wherein said output buffers also receive as an enable signal the output signal from said voltage detection circuit.

15. A memory subsystem as in claim 5, wherein said voltage detection circuit includes a time delay circuit.

16. A memory subsystem as in claim 1, wherein said output buffers comprise tri-state gates.

17. A first and second DRAM circuit forming part of a memory subsystem for a personal computer, said first and second DRAM circuits both connected to common data lines on a memory bus, each of the DRAM circuits comprising;
a plurality of memory data lines connected to the memory bus to drive a data input onto said memory bus;
tri-state gates connected to each of said memory data lines for driving data onto said memory bus, each of said tri-state gates including an enable input for enabling the data input to said gate;
said enable inputs for each of said tri-state gates comprising;
an output signal from a counter; and
an output signal from a voltage detection circuit;
said counter output signal and said voltage detection circuit output signal being ANDed together to produce said enable inputs;
wherein said counter receives a row address strobe (RAS) signal as a clock signal and the output signal from the voltage detection circuit as a reset input.

18. DRAM circuits as in claim 17, wherein said counter counts eight RAS signals before producing an enable output signal.

19. DRAM circuits as in claim 18, wherein said enable output signal disconnects said RAS clock signal.

20. A memory subsystem for a computer, comprising:
random access memory connected to a memory controller through a memory bus;
a plurality of memory data lines in said memory connected to the memory bus;
an output buffer connected to each of said memory data lines for driving data onto said memory bus, each of said output buffers including an input line for enabling or disabling said output buffer;
a counter coupled to said output buffers, said counter producing an output signal that enables or disables said output buffers;
wherein said counter counts the number of control signals generated by said memory controller, and enables said output buffers when the count reaches a predetermined value, thereby indicating completion of system power up.

21. A method for controlling output data drivers in a DRAM circuit during a computer system start-up and reset, comprising the steps of:
measuring a power supply voltage;
counting control signals generated by a memory controller;
beginning the count when the power supply voltage reaches a predetermined minimum voltage level; and
producing an output signal to enable said output data drivers after a given count is reached;
wherein said control signals comprise row address (RAS) signals.

22. The method of claim 21, wherein said counting step counts eight RAS signals before producing an enable output signal.

23. The method of claim 22, wherein after said enabling step, the method further includes discontinuing the counting of said RAS signals.

24. A method for controlling output data drivers in a DRAM circuit during a computer system start-up and reset, comprising the steps of;
measuring a power supply voltage;
counting control signals generated by a memory controller;
beginning the count when the power supply voltage reaches a predetermined minimum voltage level; and
producing an output signal to enable said output data drivers after a given count is reached;
wherein said control signals comprise column address (CAS) signals.

25. The method of claim 24, wherein said counting step counts eight CAS signals before producing an enable output signal.

26. The method of claim 25, wherein after said enabling step, the method further includes discontinuing the counting of said CAS signals.

27. An apparatus for controlling output data drivers in a DRAM circuit during a computer system start-up and reset, comprising the steps of:
means for measuring a power supply voltage;
means for counting control signals generated by a memory controller;
means for beginning the count when the power supply voltage reaches a predetermined minimum voltage level; and
means for producing an output signal to enable said output data drivers after a given count is reached;
wherein said control signals comprise row address (RAS) clock signals.

28. The apparatus of claim 27, wherein said counting means counts eight RAS clock signals before producing an enable output signal.

29. The apparatus of claim 28, wherein the apparatus further includes means for disconnecting said RAS clock signal after producing said enable output signal.

30. An apparatus for controlling output data drivers in a DRAM circuit during a computer system start-up and reset, comprising the steps of;
means for measuring a power supply voltage;
means for counting control signals generated by a memory controller;
means for beginning the count when the power supply voltage reaches a predetermined minimum voltage level; and
means for producing an output signal to enable said output data drivers after a given count is reached;

wherein said control signals comprise column address (CAS) clock signals.

31. The apparatus of claim 30, wherein said counting means counts eight CAS clock signals before producing an enable output signal.

32. The apparatus of claim 31, wherein the apparatus further includes means for disconnecting said CAS clock signal after producing said enable output signal.

* * * * *